(12) United States Patent
Mangaroo

(10) Patent No.: US 8,169,786 B2
(45) Date of Patent: May 1, 2012

(54) RUGGEDIZED HOUSING AND COMPONENTS FOR A HANDLED DEVICE

(75) Inventor: Alan Mangaroo, Oakville (CA)

(73) Assignee: Psion Teklogix Inc., Mississauga, Ontario (CA)

( * ) Notice: Subject to any disclaimer, the term of this patent is extended or adjusted under 35 U.S.C. 154(b) by 354 days.

(21) Appl. No.: 12/466,500

(22) Filed: May 15, 2009

(65) Prior Publication Data

US 2010/0128449 A1     May 27, 2010

Related U.S. Application Data

(60) Provisional application No. 61/053,804, filed on May 16, 2008.

(51) Int. Cl.
*H05K 5/00* (2006.01)
(52) U.S. Cl. .......... 361/752; 361/679.01; 361/748; 174/387; 455/575.1; 455/90.3
(58) Field of Classification Search .......... 361/752, 361/800, 816, 818, 640, 667, 679.23, 814, 361/679.01; 174/350, 50, 32, 377, 387; 455/90.3, 455/575.1, 899
See application file for complete search history.

(56) References Cited

U.S. PATENT DOCUMENTS

| | | | | |
|---|---|---|---|---|
| 5,150,282 A * | 9/1992 | Tomura et al. | ............ | 361/818 |
| 5,252,782 A * | 10/1993 | Cantrell et al. | ............ | 174/387 |
| 5,438,482 A * | 8/1995 | Nakamura et al. | ............ | 361/816 |
| 5,566,055 A * | 10/1996 | Salvi, Jr. | ............ | 361/816 |
| 5,603,103 A * | 2/1997 | Halttunen et al. | ............ | 455/575.1 |
| 6,483,719 B1 * | 11/2002 | Bachman | ............ | 361/816 |
| 6,488,425 B1 | 12/2002 | Spence et al. | | |
| 6,624,432 B1 * | 9/2003 | Gabower et al. | ............ | 250/515.1 |
| 6,680,723 B2 * | 1/2004 | Oda et al. | ............ | 345/102 |
| 6,920,344 B2 * | 7/2005 | Jang | ............ | 455/575.5 |
| 6,967,280 B1 * | 11/2005 | Boatwright et al. | ............ | 174/377 |
| 7,065,835 B2 | 6/2006 | Kuramochi | | |
| 7,149,558 B2 * | 12/2006 | Kakuguchi et al. | ............ | 455/575.8 |
| 7,362,585 B2 * | 4/2008 | Chen et al. | ............ | 361/729 |
| 7,499,645 B2 * | 3/2009 | Kubotera et al. | ............ | 396/539 |
| 7,923,647 B2 * | 4/2011 | Murakami et al. | ............ | 174/564 |
| 2003/0222845 A1 | 12/2003 | Nguyen et al. | | |
| 2004/0127270 A1 | 7/2004 | Wulff et al. | | |

OTHER PUBLICATIONS

International Search Report dated Oct. 14, 2009.

* cited by examiner

*Primary Examiner* — Angel R Estrada
*Assistant Examiner* — Dimary Lopez
(74) *Attorney, Agent, or Firm* — Ziegler IP Law Group LLC

(57) ABSTRACT

There is provided a housing for a rugged handheld device, which includes: a main housing including: a main circuit board space sealed from an exterior environment, for supporting a main circuit board; and a compartment space for supporting a removable compartment for holding a device component for operation of the handheld device, such as a docking connector board, a display assembly, a keyboard assembly, where the compartment space is sealed from the external environment by a removable compartment cover for sealing the compartment space from the exterior environment, independently from the sealing of the main circuit board space and/or the device component placed into the compartment space.

22 Claims, 22 Drawing Sheets

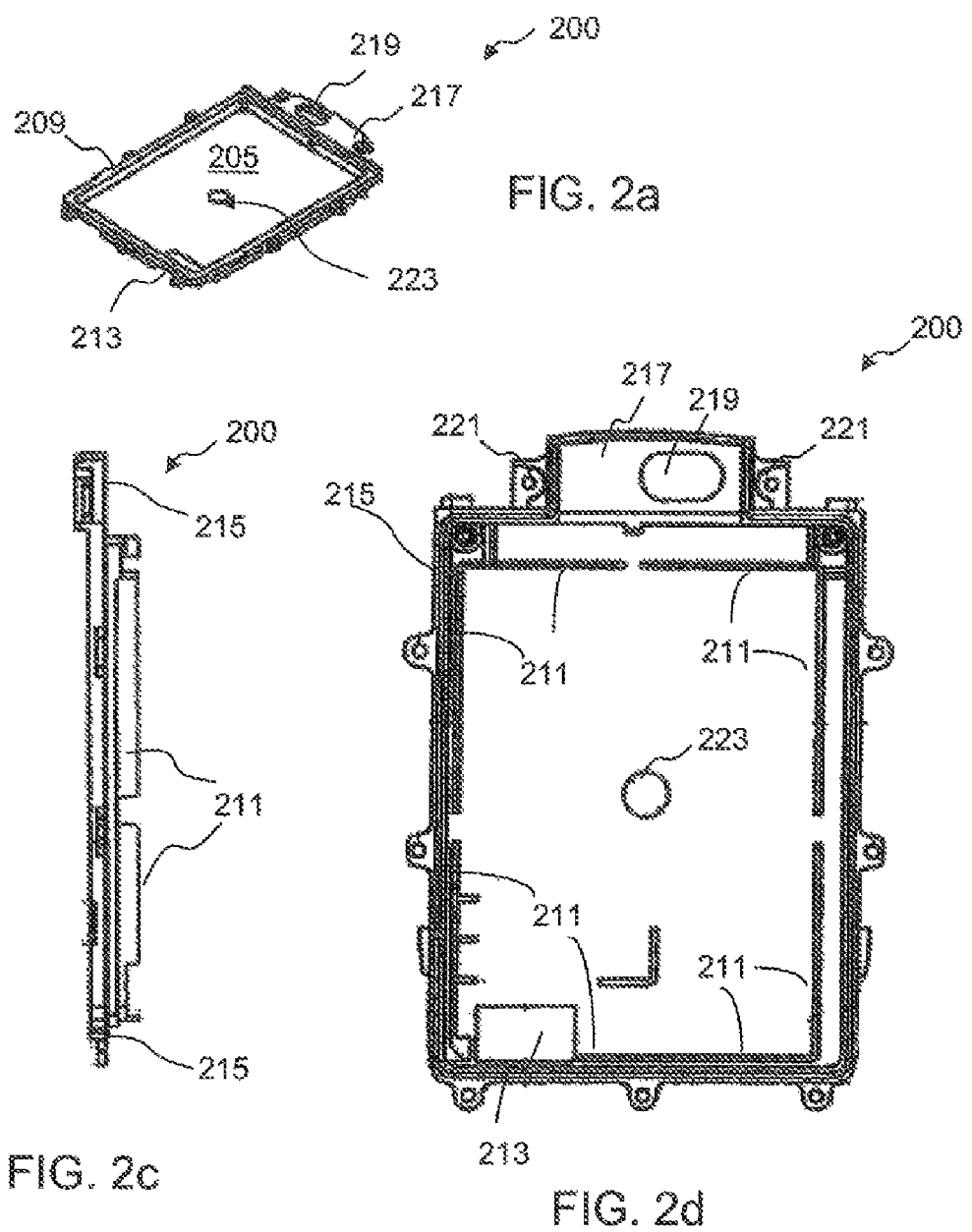

RUGGEDIZED HOUSING AND COMPONENTS FOR A HANDLED DEVICE

FIELD OF INVENTION

The present invention relates to handheld electronic devices, and more specifically to a housing and its components for rugged handheld electronic devices.

BACKGROUND OF THE INVENTION

The use of handheld devices in harsh environments has increased. For example handheld devices may be used in the Field Service, Courier/Delivery, Asset Tracking, Meter Reading, Ticketing, Retail, Livestock Tracking, and Warehousing. Handheld devices used in harsh environments may not only have to function in a wide range of operating temperatures, they may also have to withstand harsh treatment such as repeated drops onto hard surfaces. The environment that the electronic devices function in may also be dusty or wet, and as such the handheld device should prevent against the ingress of dust and water.

Rugged handheld devices that can meet the requirements of these harsh environments have unique design considerations, in addition to the design considerations of non-rugged handheld devices. For example, in order to ensure that water or dust does not enter the handheld device, the handheld device may need to meet or surpass Ingress Penetration (IP) 65 tests. Typically this has required the sealing of connections between housing components or parts using a gasket or similar seal. This can cause problems during assembly of the handheld device as the gasket must be seated correctly prior to securing housing components together. Additionally, the use of gaskets can make the resealing of housing components together in the field difficult. This has led to reducing the number of housing component connections required. While this can create a rugged device, it can make fixing the rugged handheld device in the field difficult since reducing the number of connections makes the modular replacement of components difficult.

The environment that rugged handheld devices are used in, in general results in parts needing to be replaced more often than non-rugged handheld devices. For example a touch screen may be broken by the repeated use of a screwdriver as a stylus. Docking connectors may break through repeated docking and undocking, and keyboards or keypad may wear out from use. Replacement of individual components in the field may be difficult using typical housing designs for rugged handheld devices.

Batteries of handheld devices often need to be replaced. In order to preserve information during battery replacement it is typical to include a backup battery in handheld devices. However, the size of the handheld device is limited, and the placement of the backup battery has been placed typically on the main board electronics. This makes replacing the backup battery in the field difficult. As with the other components, it may require the complete or near complete disassembly of the handheld device.

It is desirable to provide a housing for a rugged handheld device that allowed for one or more of the components to be replaced individually. It is also desirable to provide a handheld device housing that can minimize a malfunction of the handheld device. It is further desirable to provide a rugged device and a housing for the rugged device that cooperate each other so as to replace the device components smoothly and without causing the malfunction.

SUMMARY OF THE INVENTION

Provided is a ruggedized housing and components for a handheld device, which obviates or mitigates at least one of the disadvantages of existing systems.

In accordance with various embodiments of the present disclosure, there is provided a housing for a rugged handheld device, which includes: a main housing including: a main circuit board space sealed from an exterior environment, for supporting a main circuit board; and a compartment space for supporting a removable compartment for holding a device component, the device component operably coupled to the main circuit board for operating the handheld device; and a removable compartment cover for sealing the compartment space from the exterior environment, independently from the sealing of the main circuit board space.

Also provided is a housing for a rugged handheld device, which includes: a main housing including: a main circuit board space for supporting a main circuit board; and a keyboard space for housing a removable keyboard assembly, a side of the keyboard space being defined by a side wall having a protrusion extended into the keyboard space, the keyboard assembly sealing the keyboard space when placed into the keyboard space, the keyboard assembly including: an elastomer sheet sized to substantially cover a printed circuit board having a first contact for generating a keystroke signal to the main circuit board via an electrical connection, the elastomer sheet having a second contact on a first side and a protrusion on a second side opposite the first side, the second contract being in contact with the first contact of the print circuit board, the protrusion being opposite the second contact on the first side; a keypad including a shell encasing the protrusion of the elastomer sheet; and a keyboard bezel having an aperture to receive the keypad, the keyboard bezel having a side wall around a perimeter of the keyboard bezel, the side wall of the keyboard bezel having an edge in contact with the elastomer sheet to form a sealed space bellow the elastomer sheet, the keyboard bezel being held in place in the keyboard space by an interference fit with the protrusion of the side wall defining the keyboard space.

Further provided is a housing for a rugged handheld device, which includes: a main housing including: a main circuit board space for supporting a main circuit board; and a display space for supporting a display assembly, the display assembly sealing the display space, the display assembly including: a frame including: an electrical contact with the ground circuit of the main circuit board, for forming an electromagnetic interference shield; a perimeter in sealed contact with the display space; and a recessed area for receiving a display, the recessed area having an aperture opening to the main circuit board space for connecting the display to the main circuit board.

BRIEF DESCRIPTION OF THE DRAWINGS

These and other features of the invention will become more apparent from the following description in which reference is made to the appended drawings wherein:

FIG. 1b illustrates a sectional view of the main housing, taken along line A-A of FIG. 1a;

FIG. 1c illustrates a bottom view of the main housing of FIG. 1a;

FIG. 1d illustrates a back view of the main housing of FIG. 1a;

FIG. 1f illustrates a side view of the main housing of FIG. 1a;

FIG. 1e illustrates a top view of the main housing of FIG. 1a;

FIG. 2a illustrates an isometric view of an example of a display frame applicable to the main housing of FIGS. 1a-1f;

FIG. 2b illustrates a front view of the display frame of FIG. 2a;

FIG. 2c illustrates a side view of the display frame of FIG. 2a;

FIG. 2d illustrates a back view of the display frame of FIG. 2a;

FIG. 2e illustrates a top view of the display frame of FIG. 2a;

FIG. 2f illustrates a bottom view of the display frame of FIG. 2a;

FIG. 3c illustrates a sectional view of the display bezel, taken along line B-B of FIG. 3a;

FIG. 3d illustrates a back view of the display bezel of FIG. 3a;

FIG. 3b illustrates a side view of the display bezel of FIG. 3a;

FIG. 4b illustrates a front view of a keyboard bezel in the keyboard assembly of FIG. 4a;

FIG. 4c illustrates a side view of the keyboard assembly of FIG. 4a;

FIG. 4d illustrates a front view of the keyboard assembly of FIG. 4a;

FIG. 5b illustrates a front view of the battery compartment of FIG. 5a;

FIG. 5c illustrates a top view of the battery compartment of FIG. 5a;

FIG. 5d illustrates a side view of the battery compartment of FIG. 5a;

FIG. 7b illustrates a top view of a connector holder for the docking connector of FIG. 7a;

DETAILED DESCRIPTION

Figure 1E:
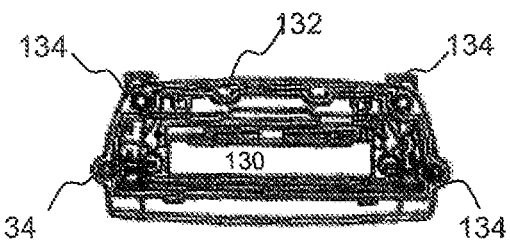

One or more currently preferred embodiments have been described by way of example. It will be apparent to persons skilled in the art that a number of variations and modifications can be made without departing from the scope of the invention as defined in the claims.

Embodiments of the present invention are described using a rugged handheld device having device components, such as a display, a keyboard or key pad, a battery, main board electronics, a docking connector for connecting the handheld device to another computer or power source, for example, located in a vehicle (such as a forklift) or combinations thereof. The handheld device may also include additional or auxiliary electronics such as, a barcode reader, RFID reader and/or writer, a smart card reader, image capture device, etc.

The handheld device has a front and back of the device. For clarity and without loss of generality, the front of the device is generally referred to as the side of the handheld device having the display and keypads. The back of the device is the side opposite the front. The left side of the device is the left side connecting the front side with the back side when seen from the front. The right side of the device is the right side connecting the front side with the back side when seen from the front. The top of the device is located closer to the display, while the bottom is located closer to the keypad or keyboard.

Referring to FIGS. 1a-1f there is shown an example of a main housing 100 for a rugged handheld device. The main housing 100 allows for individual components of the handheld device to be replaced in the field, while maintaining the IP 65 rating of the device. The main housing 100 has, for example, a general overall length 150 of approximately 220 mm, a top width 152 of approximately 100 mm, a bottom width 154 of approximately 75 mm and an overall thickness 156 of approximately 40 mm.

The main housing 100 includes spaces for receiving device components of the handheld device. In this example, these spaces include a display space 105 for housing a display or display assembly, a keyboard space 110 for housing a keyboard or keypad assembly, a connector space 115 for housing a docking connector, and a battery space 120 for housing a battery or battery compartment. The main housing 100 further includes a main circuit board housing (interior space) 125 for housing the main circuit board of the handheld device (e.g., 800 of FIG. 8), and an expansion board space 130 for housing an expansion board or auxiliary component.

The spaces 105, 110, 115, 120, 125 and 130 are formed individually so as to allow the different components to be replaced in the field. The rugged handheld device is formed by assembling a housing having the main housing 100 and device components having the display, the keyboard assembly, the docking connector, the battery, the main circuit board, and the expansion board or auxiliary component.

One skilled in the art will appreciate that the main circuit board referred to above includes the electronics for operating the handheld device. It includes, for example, a processor, and memory. The main circuit board can be electrically coupled to the different components. A cable can lead from the main circuit board to the display, keyboard, docking connector, and auxiliary component. The main circuit board may also be electrically connected to the battery for powering the main circuit board and the attached components.

One of ordinary skill in the art will appreciate that the handheld device using the main housing 100 may include device components other than the display, the keyboard, the docking connector, the battery, and the main circuit board, and the expansion board or auxiliary component.

The housing of the handheld device includes the main housing 100 and additional housing sections such as a battery cover, and a back cover for sealing the main circuit board housing 125. In order to maintain an IP65 rating for the handheld device the component spaces could be sealed using a gasket or separate seal as is well known. However, gaskets may be difficult to seat correctly when replacing components in the field. This can cause the required seal to be compromised, and result in the device no longer being IP65 rated.

In order to provide the necessary seal around the component spaces while making field replacement of individual components easy, the main housing 100 includes overmold sections that replace the separate gaskets. Each overmold section is formed around the perimeter of the aperture of the corresponding component space in the main housing 100, to seal the aperture. In this example, the overmolded section is created around the entire perimeter of each aperture of the component spaces 105, 115, 120, 125 and 130. The keyboard space 110 of the main housing depicted in FIG. 1a does not include an overmold section. The keyboard space 110 is sealed as described further herein.

In the description, the terms "overmold section", "overmolded section" and "overmolding section" may be used interchangeably.

The sealing of the component spaces is described with reference to the main circuit board space 125 of FIG. 1d. The main circuit board space 125 includes an aperture in the main housing 100 through which the main circuit board can be accessed. The aperture is sufficiently sealed in order to provide the required performance, for example IP65. The sealing includes the overmolded perimeter 127, and a back cover that fits over the aperture. The back cover includes an edge along its sealing surface (that is the surface that presses against the main housing). The edge is shaped to match the shape of the overmolded section 127. The edge of the back cover presses into the overmolded section so that when the back cover housing is secured, for example using appropriate screws in the threaded sections 129 of the main housing 100, the aperture of the main circuit board space 125 is sealed.

When forming the main housing 100, first the substrate of the main housing 100 is molded. The substrate of the main housing 100 is substantially the main housing 100, except that the overmolding is not present. The substrate of the main housing 100 may be molded from an ABS type material, for example GE C1200. With the substrate of the main housing 100 molded, the overmolding is then molded on top of the substrate. The overmolding is formed around the apertures to be sealed. The overmolding forms a continuous perimeter around the aperture. The overmolding forms a chemical bond with the substrate to ensure a substantial seal. The overmolded section provides a contiguous surface that an edge of a sealing housing or part can press against, and partially into.

In order to provide an adequate seal, the overmolded section forms a chemical bond with the substrate, and provides a semi resilient surface that an edge of the sealing surface can bite into. When using GE C1200 as the substrate, an appropriate material for the overmold is, for example, a thermoplastic rubber (TPR) with a hardness of 45-55 degree.

Each of the component spaces 105, 115, 120, and 130 has an aperture that is sealed by its corresponding overmolded section. The aperture of the display space 105 is sealed by using an overmolded section 107. The aperture of the connector space 115 is sealed by using an overmolded section 117. The aperture of the battery space 120 is sealed by using an overmolded section 122. The aperture of the expansion board space 130 is sealed by using an overmolded section 132.

An end cap or auxiliary component, forms a seal with the overmold section 132 of FIG. 1e. The end cap can be secured in place using screws and threads 134. An edge of the end cap presses against the overmold section 132 to seal the aperture 130.

The sealing of the display space 105 is described further with reference to FIGS. 2a-2e. The sealing of the keyboard space is described further with reference to FIG. 4. The sealing of the battery space is described further with reference to FIGS. 5a-5e and 6. The sealing of the connector space 115 is further described with reference to FIGS. 7a-7e.

Figure 1A:
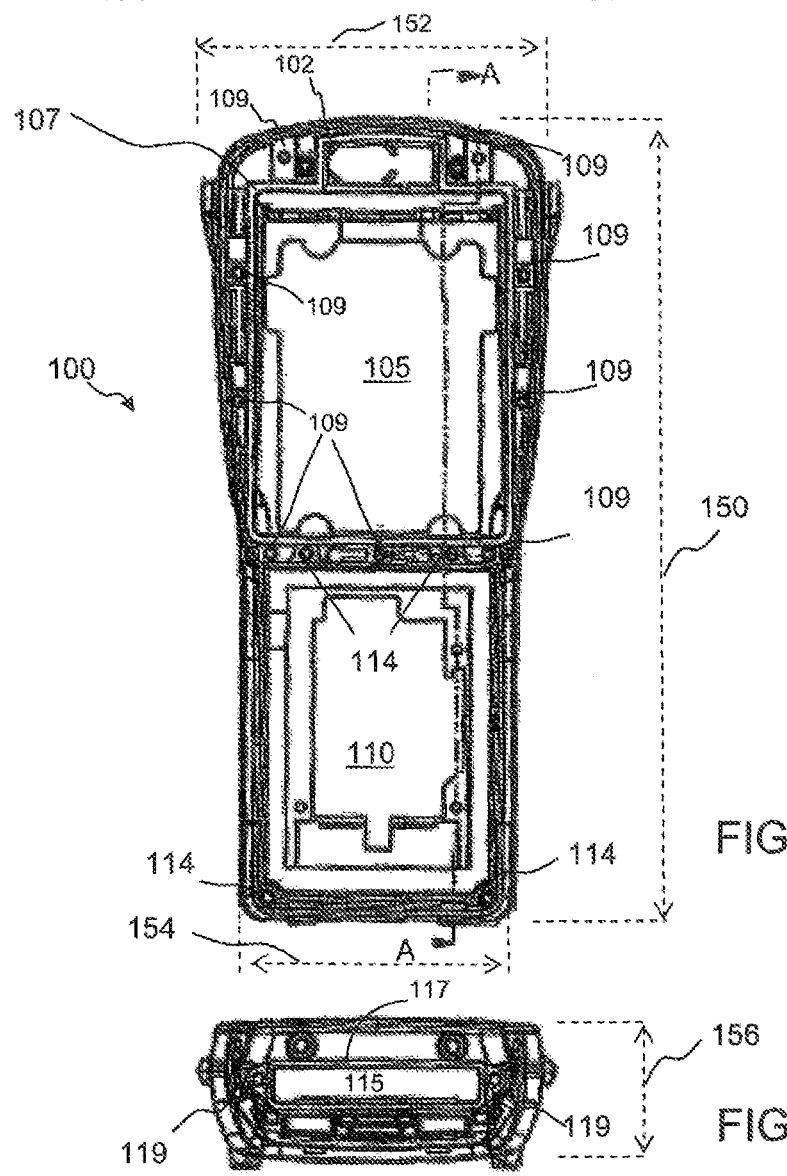
FIG. 1a illustrates a front view of an example of a main housing in accordance with an embodiment of the present disclosure.
Figure 1C:
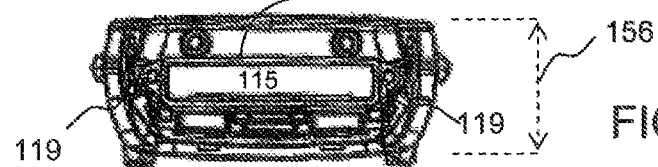
Figure 1F:
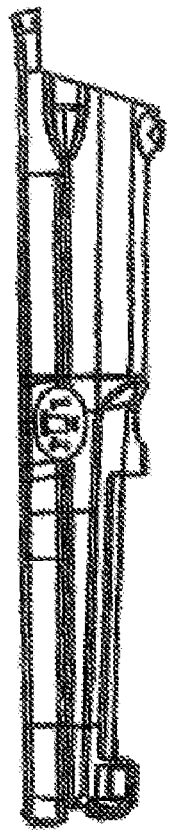
Figure 1D:
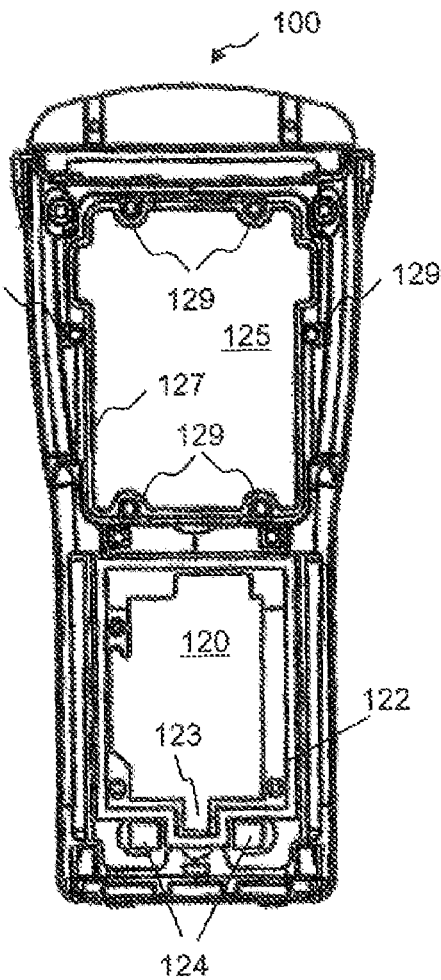
Figure 1B:
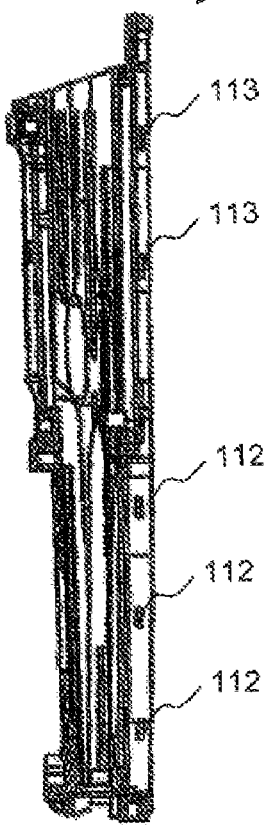
Figure 2E:
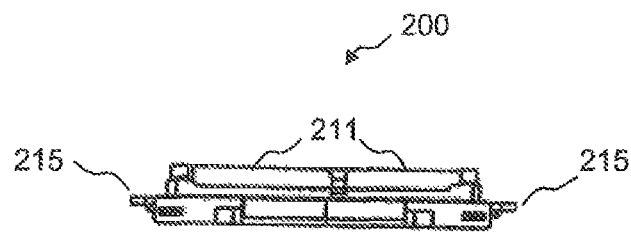
Figure 2B:
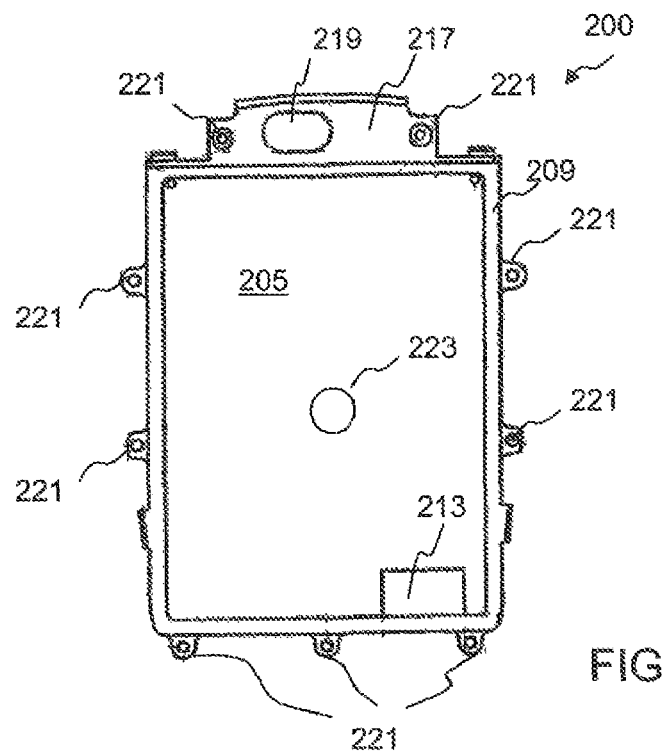
Figure 2F:
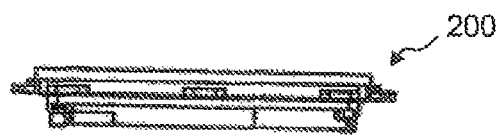
Figure 3A:
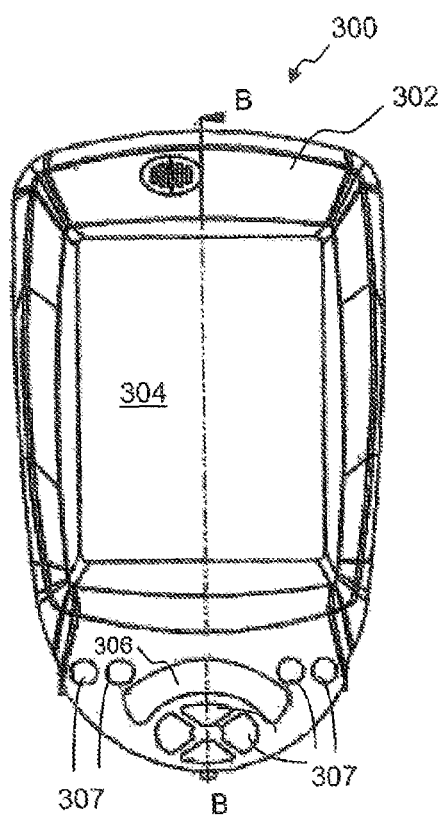
FIG. 3a illustrates a plan top view of an example of a display bezel applicable to the main housing of FIGS. 1a-1f.
Figure 3B:
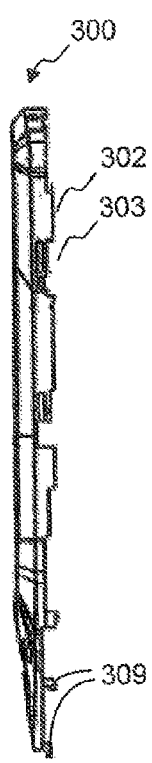
Figure 3C:
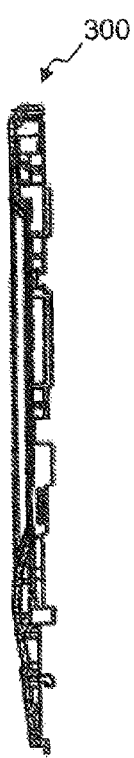
Figure 3D:
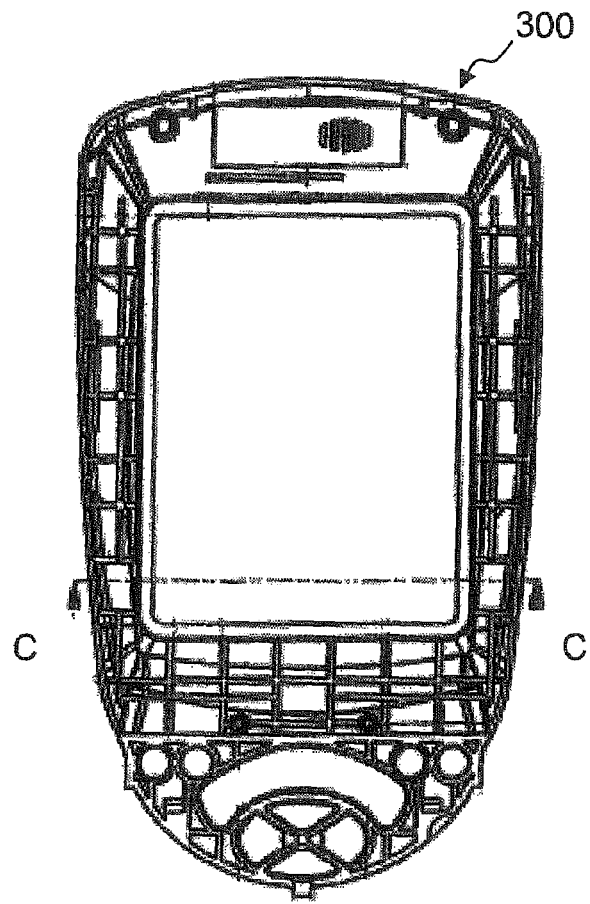
Figure 3E:
FIG. 3e illustrates a sectional view of the display bezel, taken along line C-C of FIG. 3d.
Figure 4A:
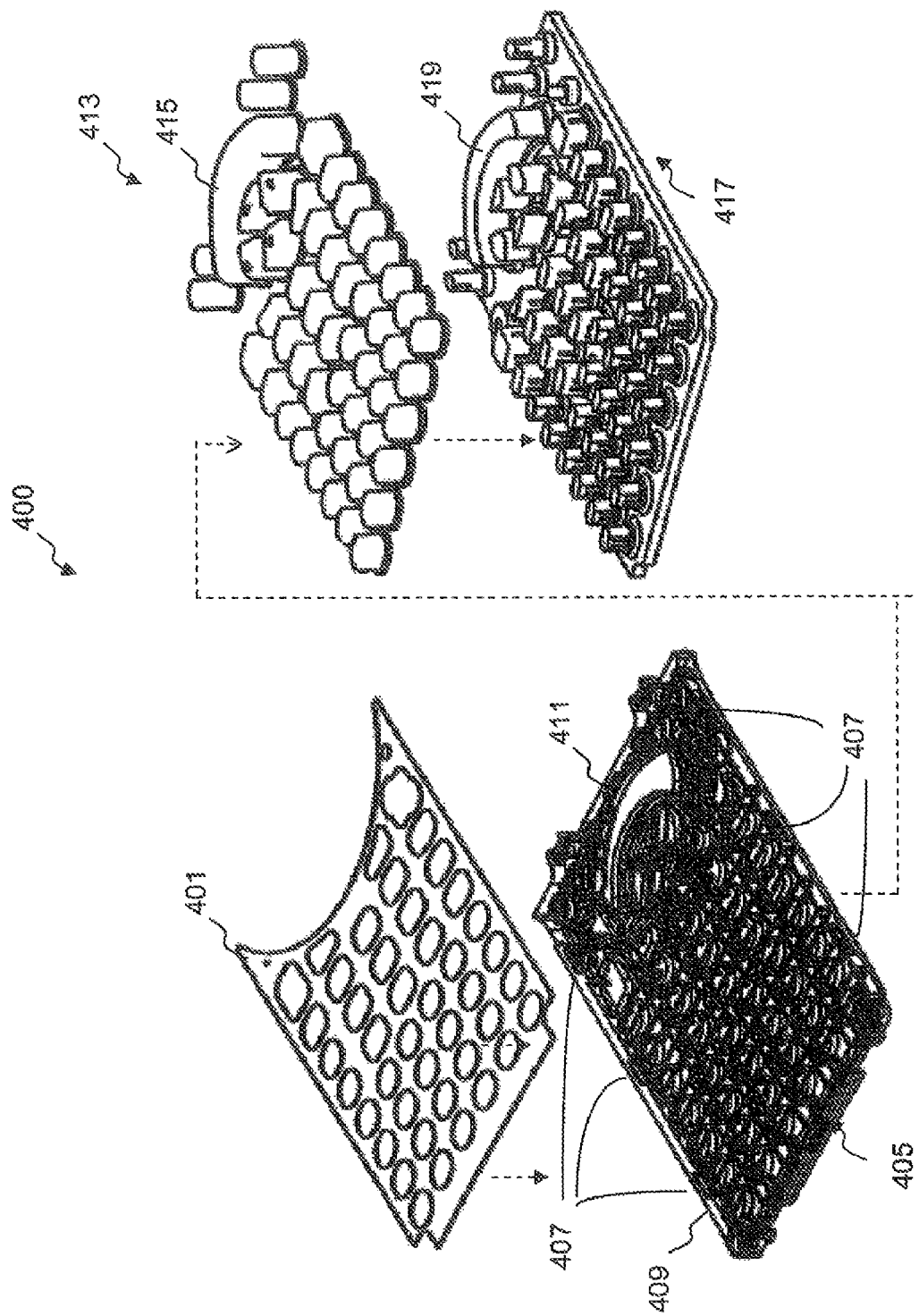
FIG. 4a illustrates an exploded view of a keyboard assembly applicable to the main housing of FIGS. 1a-1f.
Figure 4B:
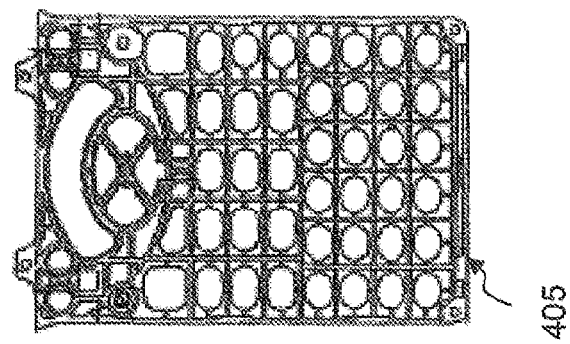
Figure 4C:
Figure 4D:
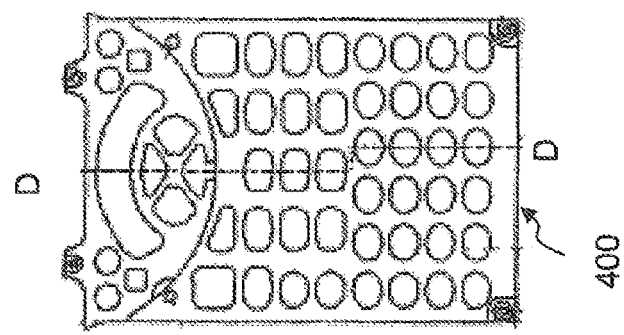
Figure 4E:
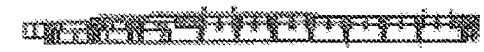
FIG. 4e illustrates a sectional view of the keyboard assembly, taken along line D-D of FIG. 4d.
Figure 5A:
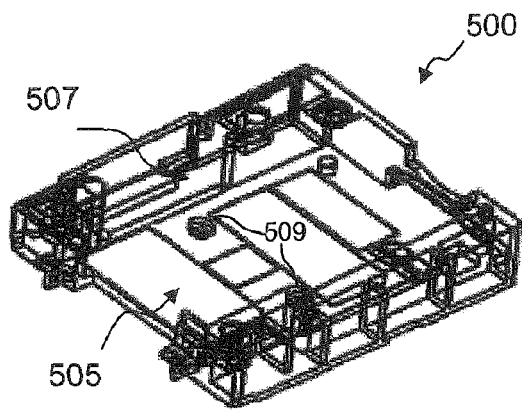
FIG. 5a illustrates an isometric view of an example of a battery compartment applicable to the main housing of FIGS. 1a-1f.
Figure 5C:
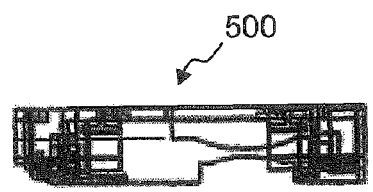
Figure 5D:
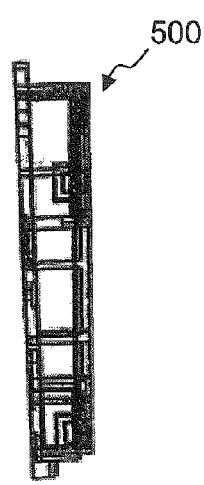
Figure 5B:
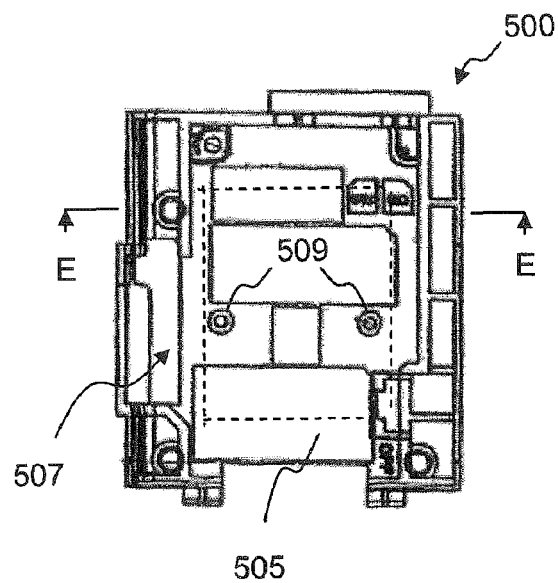
Figure 5E:
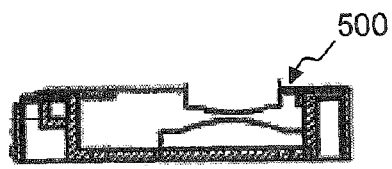
FIG. 5e illustrates a sectional view of the battery compartment, taken along line E-E of FIG. 5b.

Referring to FIGS. 1a-1f and FIGS. 2a-2f, the sealing of the display space 105 and associated components are described in detail. FIGS. 2a-2f illustrate an example of a display frame 200 for use in the main housing 100. The display frame 200 provides support for mounting the display as well as providing shielding to the main circuit board from electromagnetic interference. The display frame 200 is formed by a metal or a conductive material. The display frame 200 may include a structure for providing support to a receiver. For example structure 217 provides support for a receiver within the aperture 219. The display frame 200 also provides a means of sealing the display space 105. Displays may be delicate and unable to withstand the force required to form an adequate seal with the overmolded sections. In order to seal the display space 105, the display frame 200 is secured to the display space overmolded section 107 using screws through tabs 221 into threads 109. The display frame 200 includes an edge 215 along its perimeter shaped to match the overmold section 107. The edge 215 presses into the overmold section sealing the display frame 200 to the main housing 100. However as can be seen in FIGS. 2a, 2b, 2d the display frame 200 includes two apertures 213 and 223 in the surface of the recess 205, which are open to the main circuit board. The display space 105 is sealed from the external environment when a display is placed in the recess 205. The display may be connected to the main circuit board by a connection passing through the opening 213 in the base of the recess 205. With the display in the recess 205, the display space can be sealed by pressing an adhesive sheet around the perimeter 209 of the display frame 200 and onto the perimeter of the display. The adhesive sheet may be for example a Mylar sheet with an adhesive on one side. The Mylar sheet seals the display to the display frame 205, which in turn is sealed to the main housing 100. This arrangement allows for the display space to be sealed without overly stressing the display, or covering the display with another layer. The Mylar adhesive does not need to cover the entire surface of the display, it only needs to seal the perimeter 209 of the display with the top of the display frame 200. The apertures (hole) 223 is used as an aid to remove the display from the display frame 200 by pressing through the hole 223 on the back of the display frame 200.

In addition to providing support for the display and a means of sealing the display space, while preventing stress to the display, the display frame 200 also can provide an electromagnetic interference (EMI) shield for the main circuit board. To provide the shielding the bottom surface of the display (that is the side opposite the recess 205) include bars 211 that protrude down towards the main circuit board. The bars 211 contact corresponding bars located on the main circuit board. The bars on the main circuit board are EMI gaskets and are connected to the copper ground trace of the main circuit board. When the display frame 200 is secured to the main housing 100, the bars 211 come into contact with the bars of the main circuit board. The display frame 200 and the bars 211 are made of a conductor, for example aluminum or aluminum alloy. The display frame 200 acts as a ground plane to shield from EMI.

Referring to FIGS. 3a-3e there is shown an example of a display bezel 300 that can be fixed to the main housing 100 of FIGS. 1a-1f, for decorative purposes. The display bezel 300 includes a molded body 302, with an aperture 304 for the display. The main housing 100 has projections 113 that cooperate with indents 303 of the display bezel 300 to secure the display bezel 300. Tabs 309 may slot into corresponding apertures on the keypad bezel (e.g., 400 of FIG. 4) to secure the display bezel 300. The aperture 306 may be large so that the keypad present in the aperture may be operated one handed regardless of what hand the device is held in. For example the keypad location 306 may be operated using the thumb of the right hand or the left hand.

This elongated keypad (413 of FIG. 4) associated with the aperture 306 may be used for a common action such as initiating a barcode scan. Some previous handheld devices used multiple scan buttons to provide ambidextrous scanning functionality. By elongating the scan button and its corresponding aperture 306 on either side of the longitudinal centerline, the button can be operated regardless of what hand is used.

Referring to FIGS. 1a-1f and 4a-4e, the sealing of the keyboard space 110 and associated keyboard components are described in detail. FIGS. 4a-4e illustrate an example of components of a keyboard assembly 400. The keyboard assembly 400 includes a keyboard circuit board (not shown) that connects to the main circuit board and sits in the keyboard space 110. The keyboard assembly 400 is secured into the keyboard space 110 using screws and threads 114. The keyboard circuit board may include electrical traces that form part of a key switch. The key switch is completed by an electrical contact by a carbon pills on the underside of an elastomer 417. The elastomer 417 sits on top of the keyboard circuit board. The elastomer 417 has a number of protrusions on the side opposite the contacts. The protrusions are located above the contacts. Hard keycaps 413 are placed over the protrusions of the elastomer 417. When a keypad is pressed the contact under the protrusion presses against gold pads of the keyboard circuit board and completes a circuit sending a signal that can be sued to identify the key that was pressed.

In order to seal the keyboard space 110, a keyboard bezel 405 is placed on top of the hard keypads 413 and the elastomer 417. The key board bezel 405 has a perimeter surface 409 that presses down around the entire perimeter of the elastomer 417 contact pad to provide a seal. The keyboard bezel 405 may be held in place by projections 112 that project from the side wall of the keyboard space into the keyboard space. The projections 112 cooperate with indents 407 of the keyboard bezel 405 to form an interference type fit securing the keyboard bezel 405 in place. A keyboard sheet 401 (e.g., mylar) may be placed on top of the keyboard bezel 405. Some characters are printed on the keyboard sheet 401, which correspond to keys and visually indicate the keys' functions.

Referring to FIGS. 1a-1f and 5a-5e, the battery space 120 and associated battery components are described in detail. FIGS. 5a-5e illustrate an example of a battery compartment 500. The battery compartment 500 can be secured (for example using holes 509) in the battery space 120 of the main housing 100. The battery compartment 500 may be sealed by a battery cover (e.g., 600 of FIG. 6) as described further below. Handheld devices may include a backup battery for providing temporary power. For example when the main battery is being replaced temporary power can be supplied by the back up battery so that there is no loss of information. The backup battery may also provide power to maintain the date and time when the handheld device is turned off. In previous devices the main battery is typically easily accessible, however the backup battery has been mounted internally and not easily accessible. By contrast, in this example, the battery component 500 is formed so that the backup battery can be replaced easily. The battery compartment 500 includes a main battery space 505 for receiving and housing a main battery, as well as a backup battery space 507 for receiving and housing a backup battery. The backup battery is not directly mounted on the main circuit board. The backup battery is connected to the main printed circuit board via a harness, such as an electrical harness (e.g., cable harness). The main battery and the backup battery may be coupled to the main circuit board using different electrical harnesses (not shown), by making minimal change to the design of the main circuit board. As can be seen from FIGS. 5a and 5b, the backup battery space 507 is located adjacent to the main battery space 505. As such the backup battery can be removed or replaced when the main battery is not in the main battery space 505. The user opens the battery cover, removes the main battery, and then removes the backup battery. The backup battery is removed without removing the battery compartment 500 from the battery space 120.

The main housing 100 may include a switch to signal if the battery cover is opened. As described further below, this can be used as an indication that the main battery is going to be removed, and that the power should be shut down or switched to the backup battery to avoid loss of data.

Figure 6:
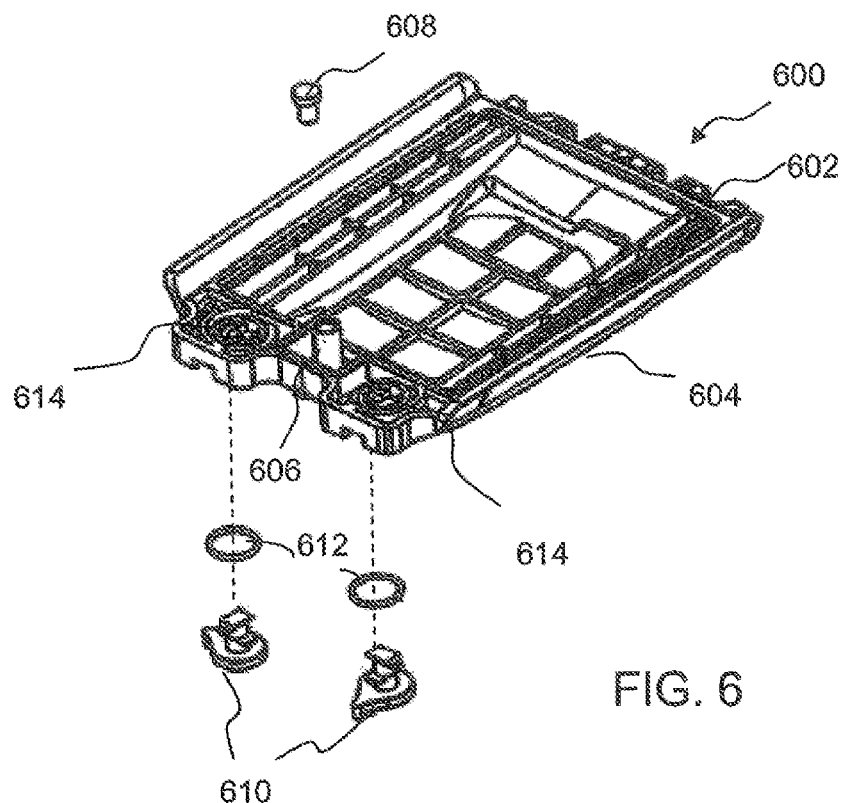
FIG. 6 illustrates an isometric view of an example of a batter cover for the battery compartment of FIGS. 5a-5e.
Figure 7A:
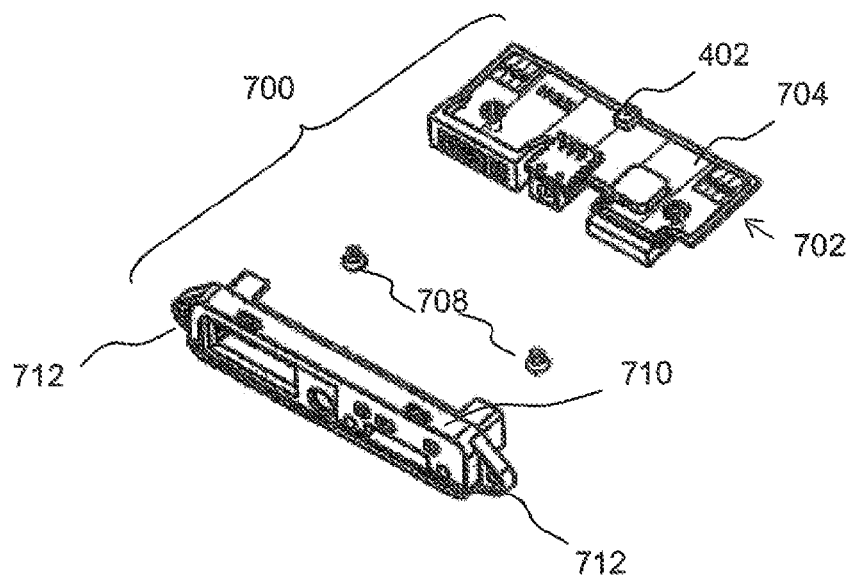
FIG. 7a illustrates an isometric view of an example of a docking connector applicable to the main housing of FIGS. 1a-1f.
Figure 7B:
Figure 7C:
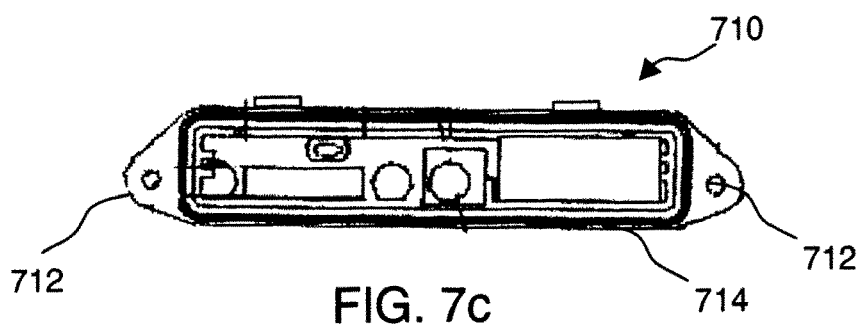
FIG. 7c illustrates a back view of the connector holder of FIG. 7b.
Figure 7D:
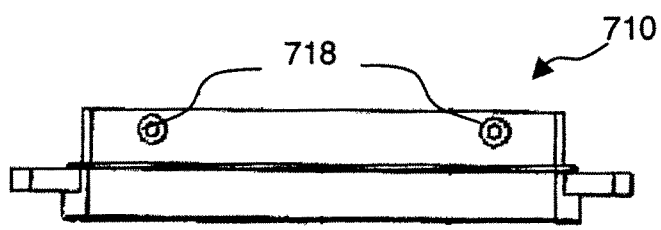
FIG. 7d illustrates a bottom view of the connector holder of FIG. 7b.
Figure 7E:
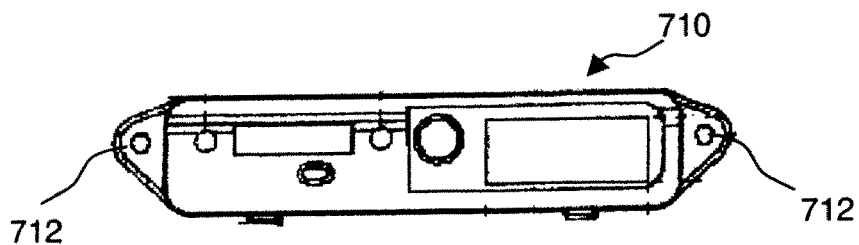
FIG. 7e illustrates a front view of the connector holder of FIG. 7b.

Referring to FIG. 6, there is shown an example of a battery cover 600 for sealing the battery space 120 of FIG. 1d. Referring to FIGS. 1d and 6, the battery cover 600 includes a substrate 604 that has an edge 602 shaped to match the overmolded section 122 of the battery space 120. The batter cover 600 includes two latches 610 that fit through corresponding openings 614 in the batter cover. The openings 614 are sealed using an o-ring 612. The two latches 610 can be rotated in the openings 614 in order to engage with apertures 124 adjacent to the battery space 120. The latches 610 bear against a surface of the aperture 124 to secure the battery cover 600 in place, and ensure that the edge 602 is pressed firmly against the overmolded section 122.

The battery cover 600 includes a protrusion 606. The protrusion 606 operates a switch (e.g., 402 of FIGS. 7 and 14) placed in the switch space 123. The switch sends a signal to the main circuit board to indicate whether the battery cover is on or not (e.g., being opened). If the battery cover is not on (the protrusion 606 is not located in the switch space 123) the hand held device may be prevented from turning on, or it may power down in preparation of battery removal. The switch may be used to shutdown the handheld device and store information temporarily using the backup battery. The switch may be used to ensure that the handheld device is not operated without the battery cover securely attached. In rugged handheld devices, the switch can be operated even when the battery cover is on. If the handheld device is dropped (for example from 1.2 meters onto concrete), the impact can cause the switch to operate which may cause the handheld device to shutdown. In order to avoid such an error operation while maintaining the resistance to dropping, the protrusion 606 is covered with an elastic sleeve 608 (e,g, rubber sleeve), hereinafter referred to as rubber sleeve 608). The rubber sleeve 608 bears against the switch and absorbs the impact when the handheld device is dropped, ensuring that the switch does not accidentally operate.

Referring to FIGS. 7a-7e, there is shown an example of a docking connector section (or compartment) 700. The docking connector section 700 includes a connector board 702 fastened to a connector holder 710 with screws 708. The connector board 702 includes a printed circuit board 704, connector electronics (not shown) and a harness (e.g., 706 of FIG. 18) for electrically coupling the connector board 702 with the main circuit board. The harness (706) is, for example, detachably coupled to a cable coupling to the main circuit board. The connector holder 710 has holes 718 on its bottom. The connector board 702 is assembled with the connector holder 710 by tightening the screws 708 into the holes 718. Docking connectors allow the handheld device to be mounted in vehicles such as forklift, delivery vans, trucks etc. or be connected to peripherals such as printers or to other computer systems to download information. The connector may wear out or break. The docking connector section 700 can be easily replaced in the field by removing the connector holder 710 from the main housing 100.

As described above the connector space 115 includes a connector overmold section 117. The connector holder 710 includes an edge 714 that presses into the connector overmold section 117 to seal the connector space 115. The docking connector 700 is secured to the main housing 100 using tabs 712 having holes with appropriate fasteners such as screws. The holes of the tables 712 are fixed with the holes (119 of FIG. 1c) of the main housing 100. The fasteners are accessible from the exterior of the handheld device. Unlike previous handheld devices that secured the docking connector using internal fasteners, the current docking connector 700 can easily be replaced in the field while maintaining the IP65 rating of the handheld device. The length of the cable connecting the connector board to the main circuit board should be long enough to allow the docking connector 700 to be removed from the main housing. However it should be noted that making the cable too long can result in the cable interfering with the seal between the edge 714 and the overmolded section 717.

Figure 8:
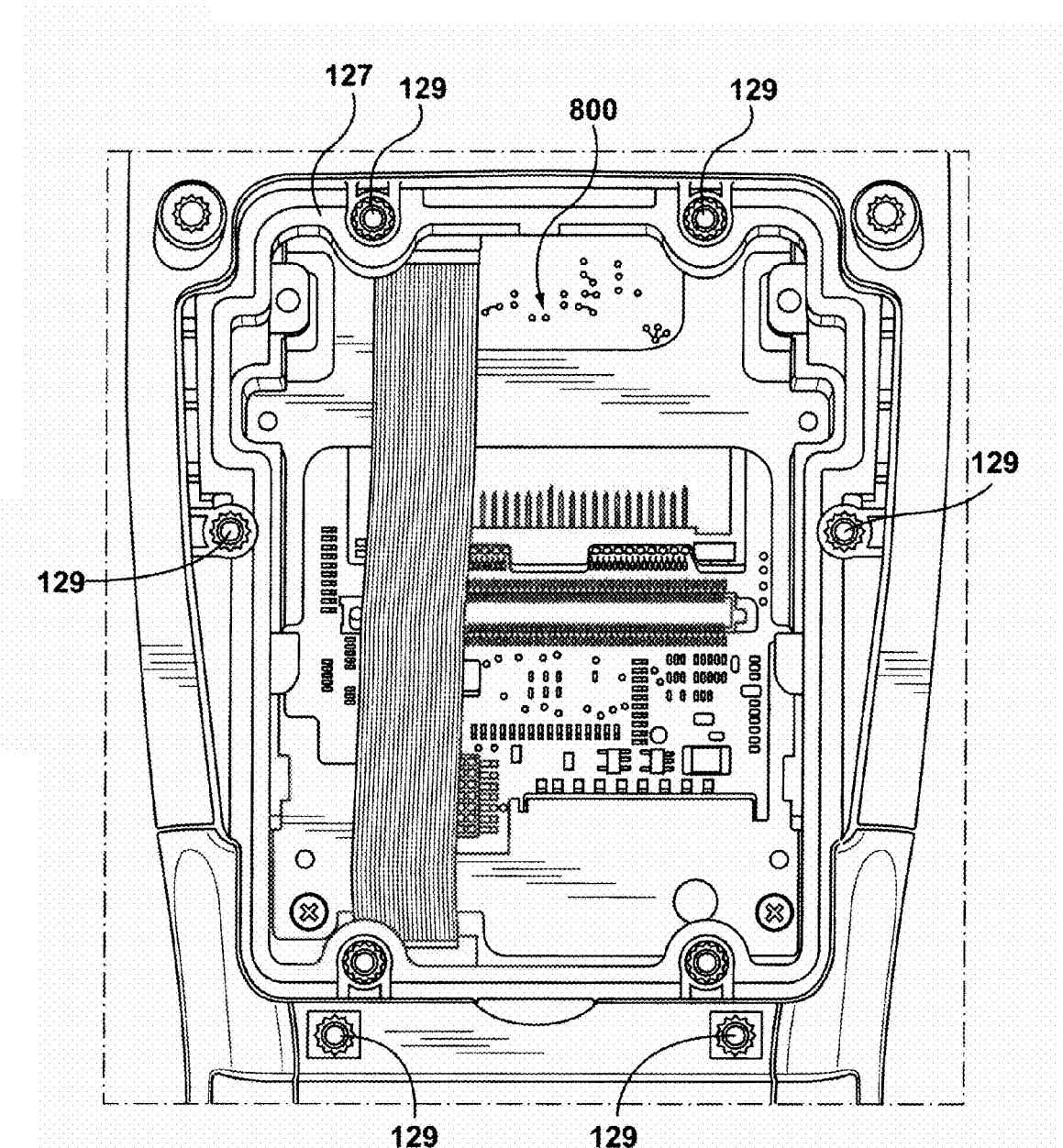
FIG. 8 depicts in a photograph a detailed view of the main housing corresponding to FIGS. 1a-1f.

Referring to FIG. 8 there is shown in a photograph a detailed view of a back of the main housing corresponding to 100 of FIGS. 1a-1f for a rugged handheld device. The main circuit board 800 is seen in the main housing. The overmolded section 127 for sealing the opening is shown.

Figure 9:
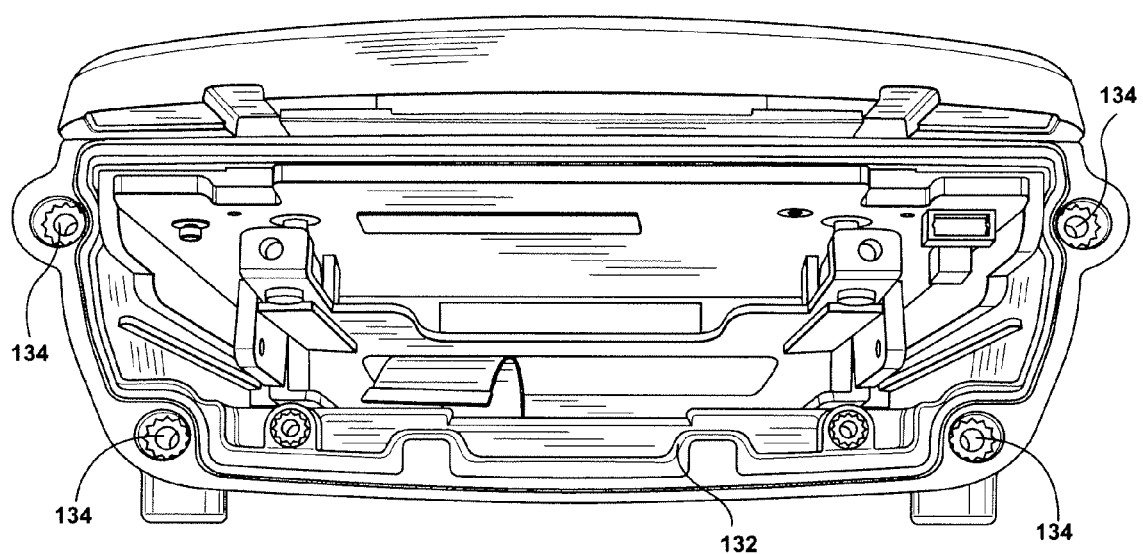
FIG. 9 depicts in a photograph a detailed view of an end cap opening of the main housing corresponding to FIGS. 1a-1f.

Referring to FIG. 9 there is shown in a photograph a view of the top of the main housing corresponding to FIG. 1e for the handheld device. The overmolded section 132 is shown.

Figure 10:
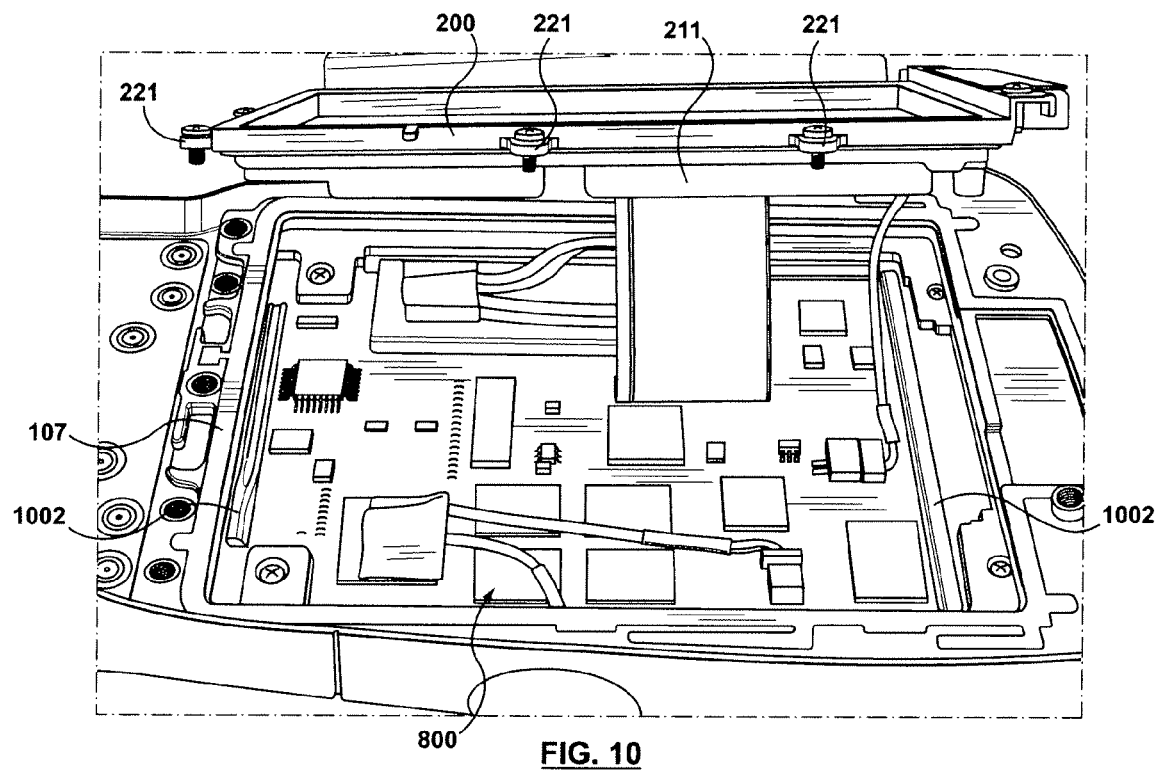
FIG. 10 depicts in a photograph a detailed view of the main housing corresponding to FIGS. 1a-1f and the display frame corresponding to FIGS. 2a-2f.

Referring to FIG. 10 there is shown in a photograph a view of the display frame corresponding to 200 of FIGS. 2a-2f and the display space overmolded section corresponding to 107 of FIG. 1a. The bars 211 of the display frame are shown as well as corresponding bars 1002 on the main circuit board. Also shown is the main circuit board 800.

Figure 11:
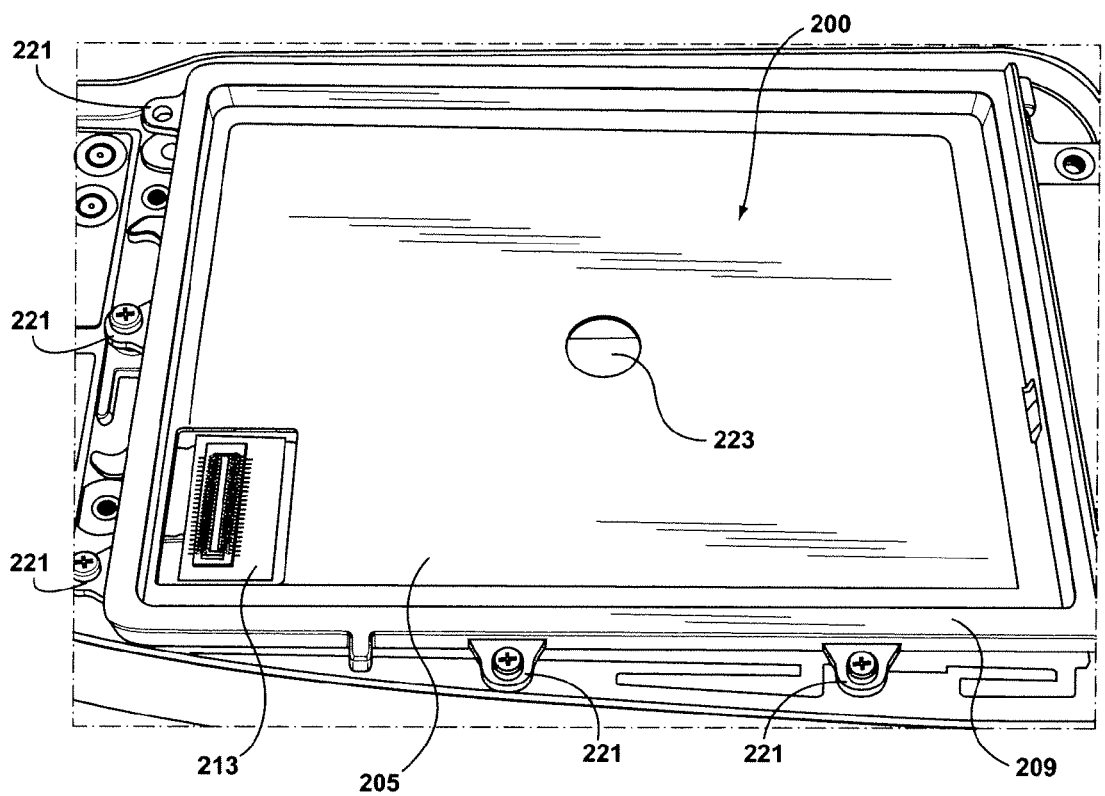
FIG. 11 depicts in a photograph a detailed view of the display frame corresponding to FIGS. 2a-2f.

Referring to FIG. 11, there is shown a photograph of the display frame corresponding to 200 of FIGS. 2a-2f. The recess 205 having two openings 213 and 223 are shown. The exterior frame 209 for sealing to the display is also shown.

Figure 12:
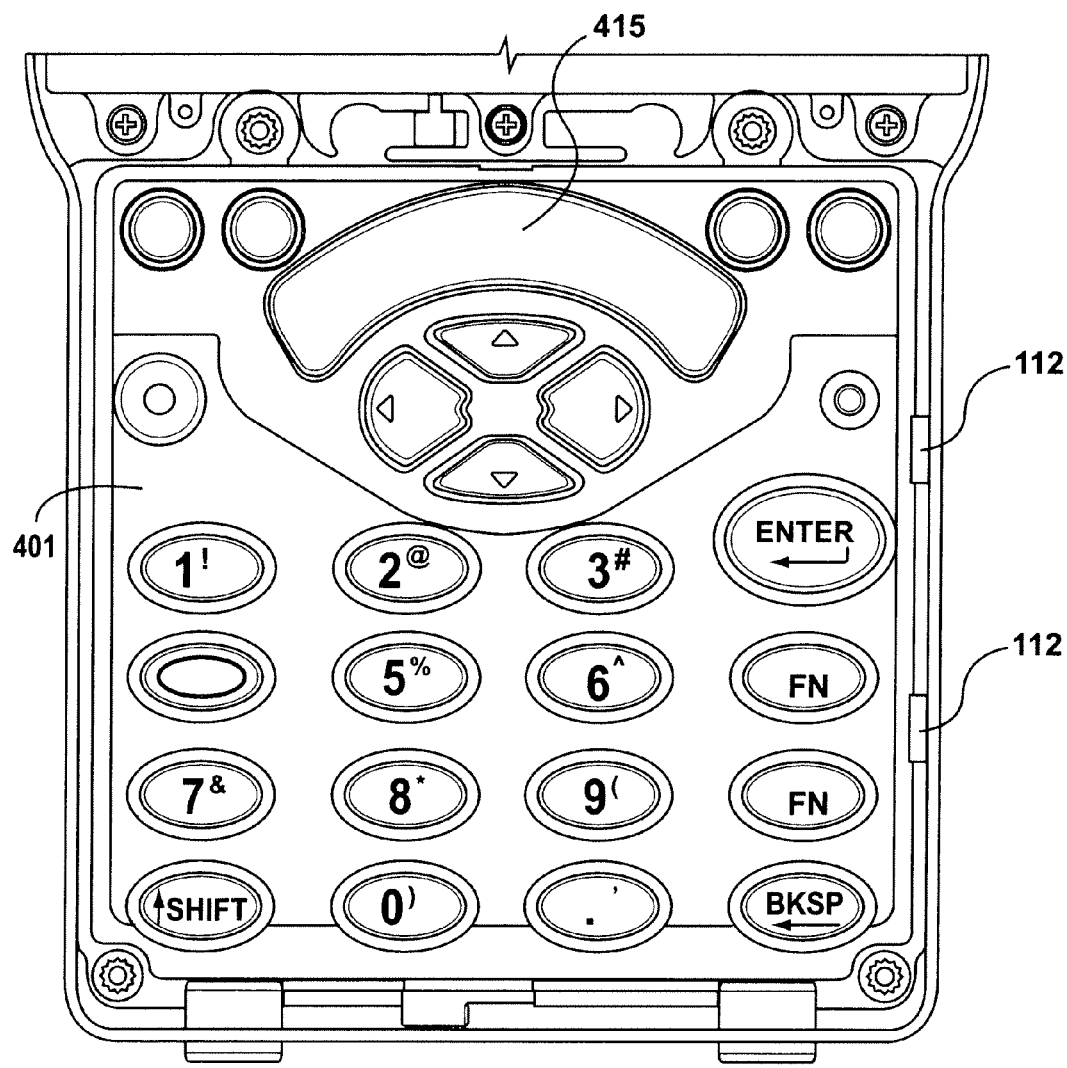
FIG. 12 depicts in a photograph a detailed view of the keypad housing corresponding to FIGS. 4a-4d.

Referring to FIG. 12 there is shown in a photograph a view of a partially assembled keypad assembly of the handheld device, associated with 400 of FIGS. 4a-4e. The protrusions 112 are shown. The elastomer contact pad is also shown located on top of the keypad circuit board. The hard key pads 415 are shown on top of the protrusions of the elastomer contact pad.

Figure 13:
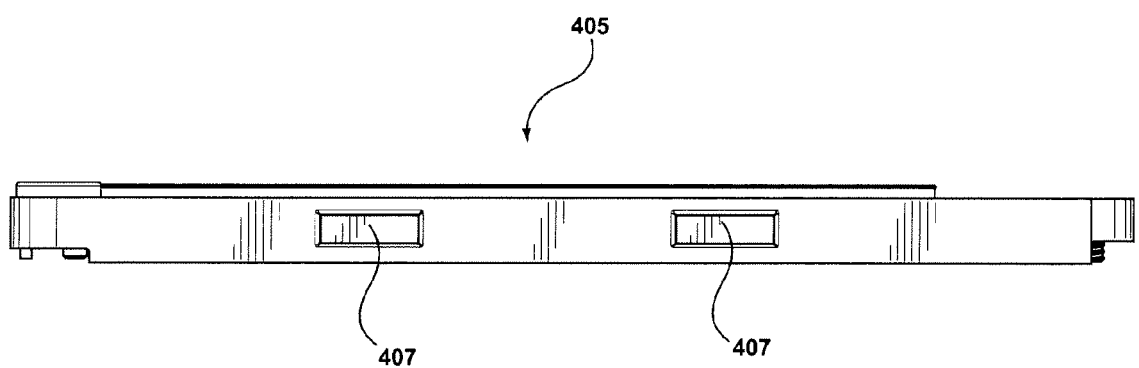
FIG. 13 depicts in a photograph a detailed view of the keypad bezel corresponding to FIGS. 4a-4d.

Referring to FIG. 13 there is shown in a photograph a side view of the keyboard bezel corresponding to 405 of FIGS. 4a-4e, for the handheld device. The indents 407 in the side wall of the bezel are shown.

Figure 14:
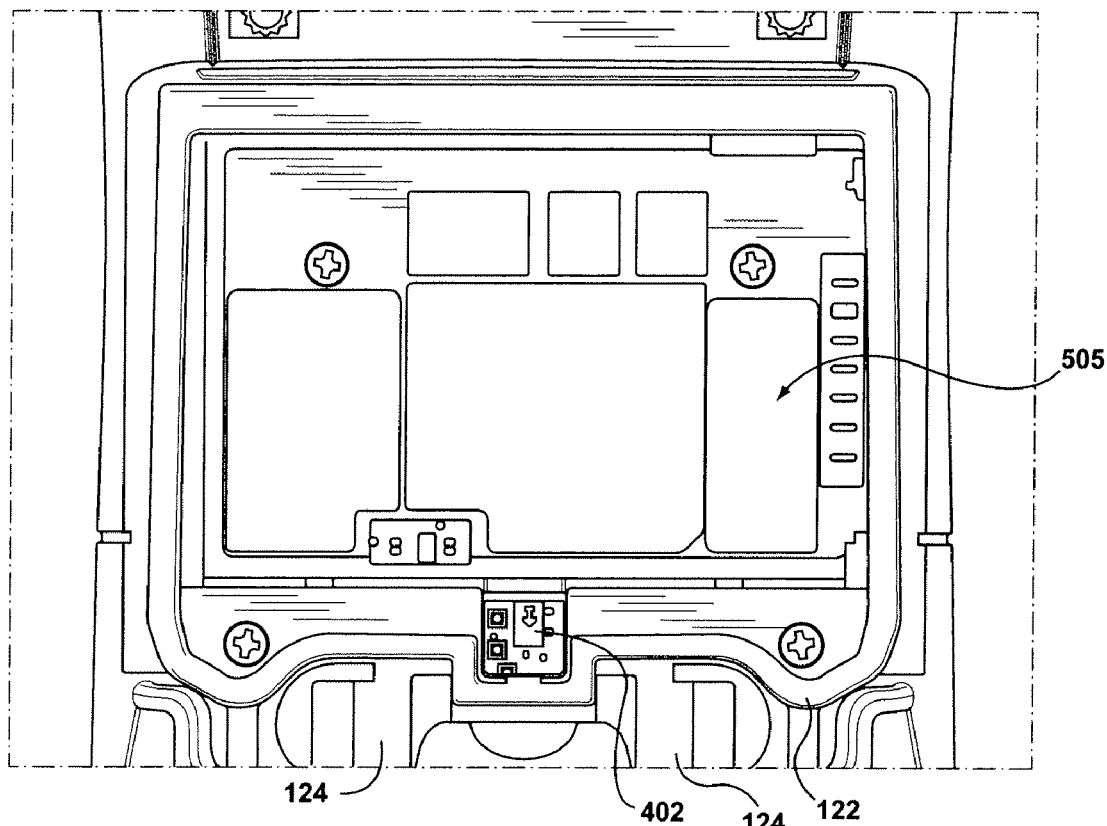
FIG. 14 depicts in a photograph a detailed view of the battery compartment corresponding to FIGS. 5a-5e.

Referring to FIG. 14 there is shown in a photograph the battery compartment corresponding to 500 of FIGS. 5a-5e. The overmolded section 122 for sealing the battery space is shown. The switch 402 for signaling if the cover is attached is also shown.

Figure 15:
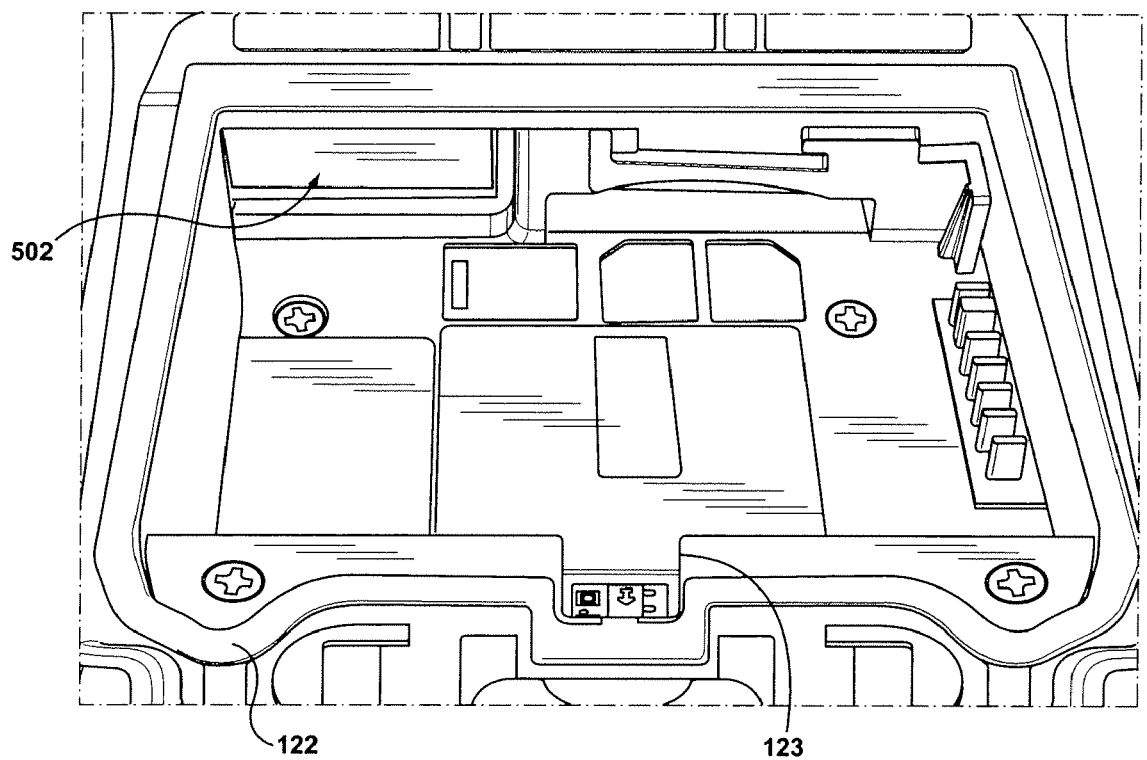
FIG. 15 depicts in a photograph a detailed view of a backup battery for the battery compartment of FIG. 14.
Figure 16:
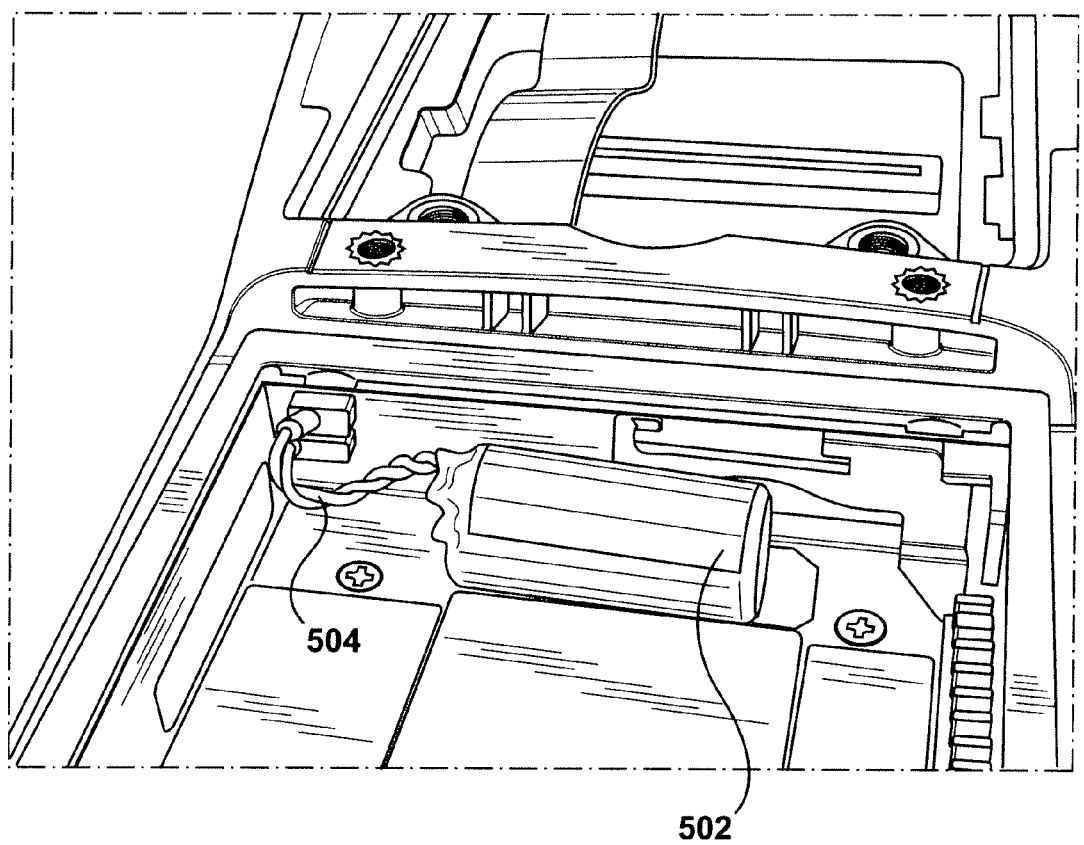
FIG. 16 depicts in a photograph another detailed view of a backup battery for the battery compartment of FIG. 14.

Referring to FIGS. 15 and 16 there is shown the backup battery 502 located in the backup battery space (507 of FIG. 15), as well as removed from the backup battery space. As can be seen in FIG. 16, the backup battery 502 may be connected to an electrical harness via wires 504.

Figure 17:
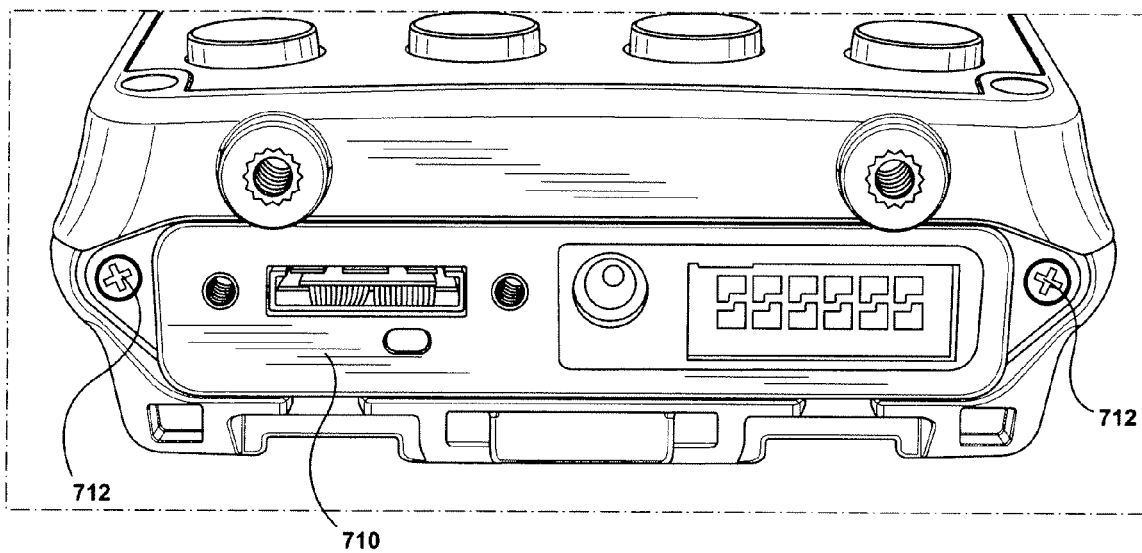
FIG. 17 depicts in a photograph a detailed view of the docking connector corresponding to FIGS. 7a-7e.
Figure 18:
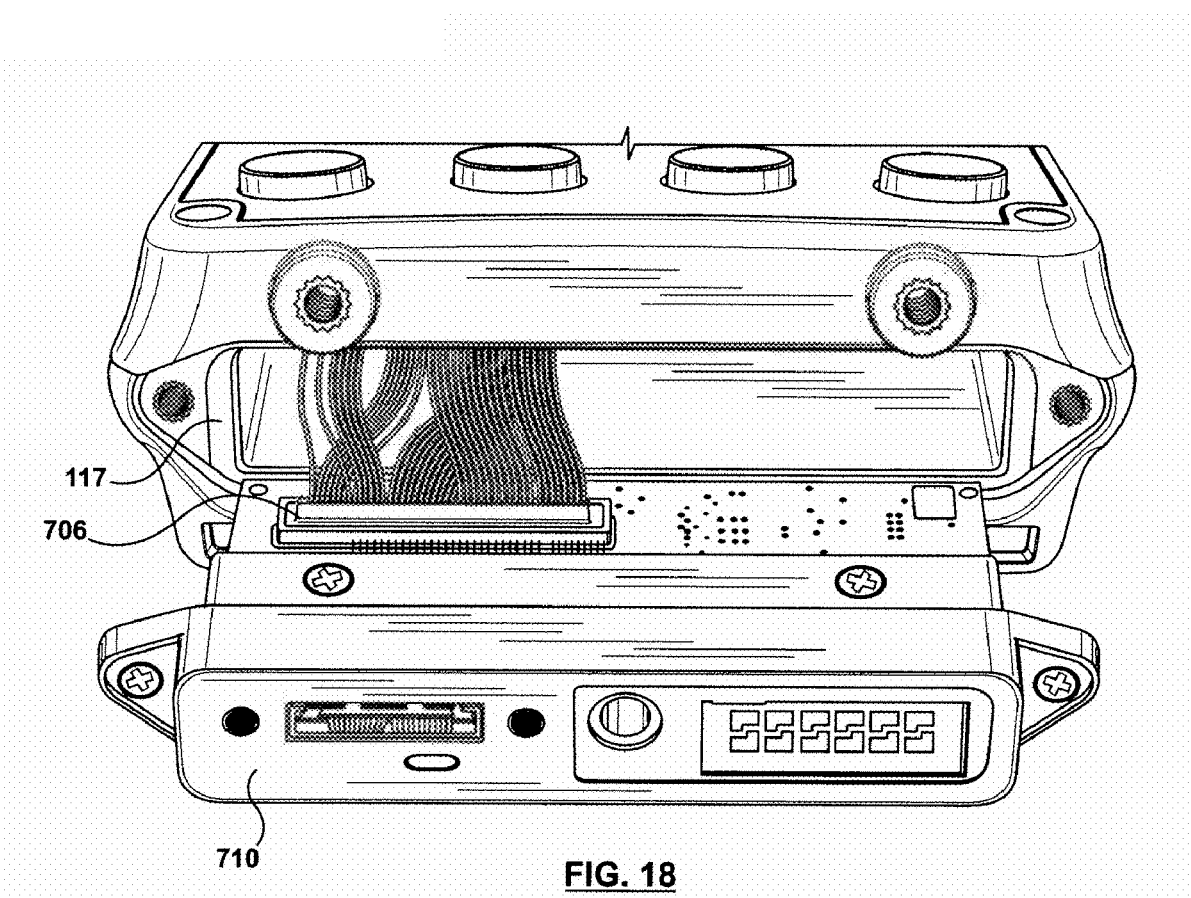
FIG. 18 depicts in a photograph another detailed view of the docking connector corresponding to FIGS. 7a-7e.

Referring to FIGS. 17 and 18, there is shown in photographs the docking connector corresponding to 700 of FIGS. 7a-7e, for the handheld device. FIG. 17 shows the connector holder 710 secured to the main housing using externally accessible fasteners 712. FIG. 18 shows the docking connector 700 removed from the main housing. The connector holder 710 has been unscrewed from the main housing. The overmolded section 117 is shown. The connector 706 is shown, the connecting wires of an appropriate length so as to allow the docking connector to be removed from the main housing, but not interfere with the seal between the edge of the connector holder and the overmolded section.

The housing for a handheld device described herein provides for individually replaceable components which provides greater lifespan for the handheld device since if a component breaks it can easily be replaced. Further more, the replacement of the individual components can be easily accomplished in the field while maintaining the ruggedness of the handheld device. Gaskets are not required, which can provide a poor seal if not seated correctly. The use of gaskets has been replaced with an overmold section surrounding openings in the main housing. The substrate of the housing is provided, for example, by GE C1200 and the overmolded sections by TPR.

Further still the single piece display frame described provides for EMI shielding, sealing of the display space, and providing a strong display mounting point. The display frame is a single piece and so requires less time to assemble during manufacture, and can be replaced quicker and easier in the field.

Further still, the ergonomic scan keypad allows its operation using either hand. The keypad is located centrally along a longitudinal axis of the handheld device and extends laterally an equal distance to both sides, allowing operation with, for example, the left thumb or the right thumb.

Further still an advantageous battery compartment is described that provides for the easy replacement of the backup battery when the main battery is not in the battery compartment. A rugged battery cover that provides greater resistance to undesired operation of a battery cover switch is described.

Further still the docking connector provides for easy field replacement through externally accessible fastening means.

While the present disclosure describes various embodiments, one skilled in the art will recognize that various components can be replaced, omitted or combined and other components added with out departing from scope of the disclosure.

What is claimed is:

1. A housing for a rugged handheld device comprising:
a main housing including:
a main circuit board space sealed from an exterior environment, for supporting a main circuit board; and
a compartment space for supporting a removable compartment for holding a device component, the device component operably coupled to the main circuit board for operating the handheld device, the device component comprising a docking connector board removably coupled to the main circuit board; and
a removable compartment cover for sealing the compartment space from the exterior environment, independently from the sealing of the main circuit board space, the compartment cover comprising a docking holder for housing the connector board into the compartment space, the docking holder being secured to the main housing a removable connector accessible from the exterior of the main housing.

2. A housing according to claim 1, wherein the spaces of the main housing are formed individually so as to allow the main circuit board and the compartment to be replaced individually.

3. A housing according to claim 1, wherein the main housing comprises:
an overmolded section created around a perimeter of each space, for sealing the corresponding space.

4. A housing according to claim 3, wherein the compartment space is sealed by the corresponding overmolded section and an edge section of the compartment cover.

5. A housing according to claim 1, wherein the device component comprise:
a battery, and
wherein the compartment cover comprises:
a protrusion for operating on a switch for communicating with the main circuit board, the protrusion being covered by an elastic cover for absorbing external impact on the cover when the cover is secured to the main housing.

6. A housing according to claim 5, wherein the compartment space comprises:
a docking connector space for housing the docking connector board, the switch being on the connector board and being placed in the compartment space when the connector board is in the docking connector space.

7. A housing according to claim 5, wherein the elastic cover comprises:
a rubber sleeve.

8. A housing according to claim 1, wherein the device component comprises:
a main battery for supplying power to the handheld device; and
a backup battery for supplying power to the handheld device when the main battery is not present, and
wherein the compartment comprises:
a main battery space for holding the main battery, the main battery being accessible thought the cover and removably placed in the main battery space; and
a backup battery space for holding the backup battery, the backup battery being removable from the backup battery space through the main battery space when the main battery is not present in the main battery space.

9. A housing according to claim 8, wherein the backup battery is detachably coupled to the main circuit board using a harness.

10. A housing according to claim 1, wherein the docking holder comprises:
a hole being coupled to a hole in the main housing by the connector.

11. A housing according to claim 1, wherein the docking holder comprises:
a hole being coupled to the connector board by another removable connector.

12. A housing according to claim 1, wherein the main housing comprise at least one of:
a space for holding a display in the housing;
a space for holding a keyboard in the housing;
a space for holding a docking connector in the housing; and
a space for holding an expansion board or auxiliary component in the housing,
and wherein each of the spaces is individually sealed from the exterior environment.

13. A housing for a rugged handheld device comprising:
a main housing including:
a main circuit board space for supporting a main circuit board; and
a keyboard space for housing a removable keyboard assembly, a side of the keyboard space being defined by a side wall having a protrusion extended into the keyboard space, the keyboard assembly sealing the keyboard space when placed into the keyboard space,
the keyboard assembly comprising:
an elastomer sheet sized to substantially cover a printed circuit board having a first contact for generating a keystroke signal to the main circuit board via an electrical connection, the elastomer sheet having a second contact on a first side and a protrusion on a second side opposite the first side, the second contact being in contact with the first contact of the print circuit board, the protrusion being opposite the second contact on the first side;
a keypad comprising a shell encasing the protrusion of the elastomer sheet; and
a keyboard bezel having an aperture to receive the keypad, the keyboard bezel having a side wall around a perimeter of the keyboard bezel, the side wall of the keyboard bezel having an edge in contact with the elastomer sheet to form a sealed space bellow the elastomer sheet, the keyboard bezel being held in place in the keyboard space by an interference fit with the protrusion of the side wall defining the keyboard space.

14. A housing according to claim 13, wherein the spaces of the main housing are formed individually so as to allow the main circuit board and the keyboard assembly to be replaced individually.

15. A housing according to claim 13, wherein the main housing comprises:
an overmolded section created around a perimeter of each space, for sealing the space.

16. A housing according to claim 13, wherein the main housing comprise at least one of:
a space for holding a display in the housing;
a space for holding a docking connector in the housing; and
a space for holding an expansion board or auxiliary component in the housing, and wherein each of the spaces is individually sealed from the exterior environment.

17. A housing for a rugged handheld device comprising:

a main housing including:

a main circuit board space for supporting a main circuit board;

a display space for supporting a display assembly, the display assembly sealing the display space; and at least one of a space for holding a keyboard in the housing, a space for holding a docking connector in the housing, and a space for holding an expansion board or auxiliary component in the housing, each of the spaces being individually sealed from the exterior environment, the display assembly comprising:

a frame including:

an electrical contact with the ground circuit of the main circuit board, for forming an electromagnetic interference shield;

a perimeter in sealed contact with the display space; and a recessed area for receiving a display, the recessed area having an aperture opening to the main circuit board space for connecting the display to the main circuit board.

18. A housing according to claim 17, wherein the perimeter of the frame is sealable to the surface of the display using an adhesive material.

19. A housing according to claim 17, wherein the frame is a metal frame acting as a ground plane.

20. A housing according to claim 17, wherein the frame comprises:

a back side opposite to a side having the sealed perimeter and having the electrical contact with the main circuit board.

21. A housing according to claim 17, wherein the spaces of the main housing are formed individually so as to allow the main circuit board and the display assembly to be replaced individually.

22. A housing according to claim 17, wherein the main housing comprises:

an overmolded section created around a perimeter of each space, for sealing the space.

* * * * *